United States Patent
Aton

(10) Patent No.: US 8,281,262 B2
(45) Date of Patent: Oct. 2, 2012

(54) PARTITIONING FEATURES OF A SINGLE IC LAYER ONTO MULTIPLE PHOTOLITHOGRAPHIC MASKS

(75) Inventor: Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 200 days.

(21) Appl. No.: 12/630,330

(22) Filed: Dec. 3, 2009

(65) Prior Publication Data

US 2010/0167537 A1    Jul. 1, 2010

Related U.S. Application Data

(60) Provisional application No. 61/141,611, filed on Dec. 30, 2008.

(51) Int. Cl.
*G06F 17/50*   (2006.01)

(52) U.S. Cl. .............. 716/50; 716/51; 716/52; 716/53; 716/54; 716/55

(58) Field of Classification Search .............. 716/50, 716/51, 52, 53, 54, 55, 119, 126
See application file for complete search history.

(56) References Cited

U.S. PATENT DOCUMENTS 5,761,075 A * 6/1998 Oi et al. ........................ 716/55
5,764,533 A * 6/1998 deDood ........................ 716/122

* cited by examiner

*Primary Examiner* — Vuthe Siek
*Assistant Examiner* — Brian Ngo
(74) *Attorney, Agent, or Firm* — Warren L. Franz; Wade J. Brady, III; Frederick J. Telecky, Jr.

(57) ABSTRACT

One embodiment relates to a computer method of providing an electronic mask set for an integrated circuit (IC) layer. In the method, a first electronic mask is generated for the IC layer. The first electronic mask includes a first series of longitudinal segments from the IC layer, where the first series has fewer than all of the longitudinal segments in the IC layer. A second electronic mask is also generated for the IC layer. The second electronic mask includes a second series of longitudinal segments from the IC layer, where the second series has fewer than all of the longitudinal segments in the IC layer and differs from the first series. The first and second masks are generated so a coupling segment extends traverse to the first direction and couples one longitudinal segment on the IC layer to another longitudinal segment on the IC layer.

16 Claims, 12 Drawing Sheets

PARTITIONING FEATURES OF A SINGLE IC LAYER ONTO MULTIPLE PHOTOLITHOGRAPHIC MASKS

FIELD

The disclosure herein relates generally to integrated circuits, and more particularly for systems and methods for using multiple lithographic masks to pattern a single layer on an integrated circuit.

BACKGROUND

Integrated circuits are generally mass produced by semiconductor design companies. In designing the integrated circuit, engineers at a design company use computer-aided tools to develop an electronic mask set, which represents different layers of the integrated circuit. This electronic mask set is then used to generate a set of physical masks, which are in turn used to fashion features on different layers of a physical integrated circuit during manufacturing.

As design companies strive to deliver more powerful integrated circuits at lower cost points, the design companies continuously try to "pack" more transistors into a given area on each integrated circuit. This is often achieved by shrinking feature sizes of the devices, which generally results in integrated circuits that exhibit improved speed and power characteristics. Although shrinking is often advantageous from a performance perspective, it is often difficult from a manufacturing perspective to continue to shrink device features from one technology node to the next.

In particular, it is becoming especially difficult to pattern interconnect lines, which tend to be very closely spaced. Thus, during photolithography, the close proximity of the interconnect lines gives rise to a lack of contrast between exposed and unexposed photoresist regions which correspond to the interconnect lines. This lack of contrast makes it difficult, if not impossible, to form interconnect lines in extremely close proximity using traditional techniques. Accordingly, new methods and systems for patterning layers of integrated circuits are needed.

BRIEF SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

One embodiment relates to a computer method of providing a photolithography mask set for an integrated circuit (IC) layer. In the method, a first mask is generated for the IC layer. The first mask includes a first series subset of longitudinal segments from the IC layer. A second mask is also generated for the IC layer. The second mask includes a second series different subset of longitudinal segments from the IC layer. The first and second masks are generated to include coupling segments traversely coupling different longitudinal segments. Other systems and methods are also disclosed.

The following description and annexed drawings set forth certain illustrative aspects. Other aspects, advantages and/or features may, however, become apparent from the following detailed description when considered in conjunction with the annexed drawings.

NOTATION AND NOMENCLATURE

Figure 1:
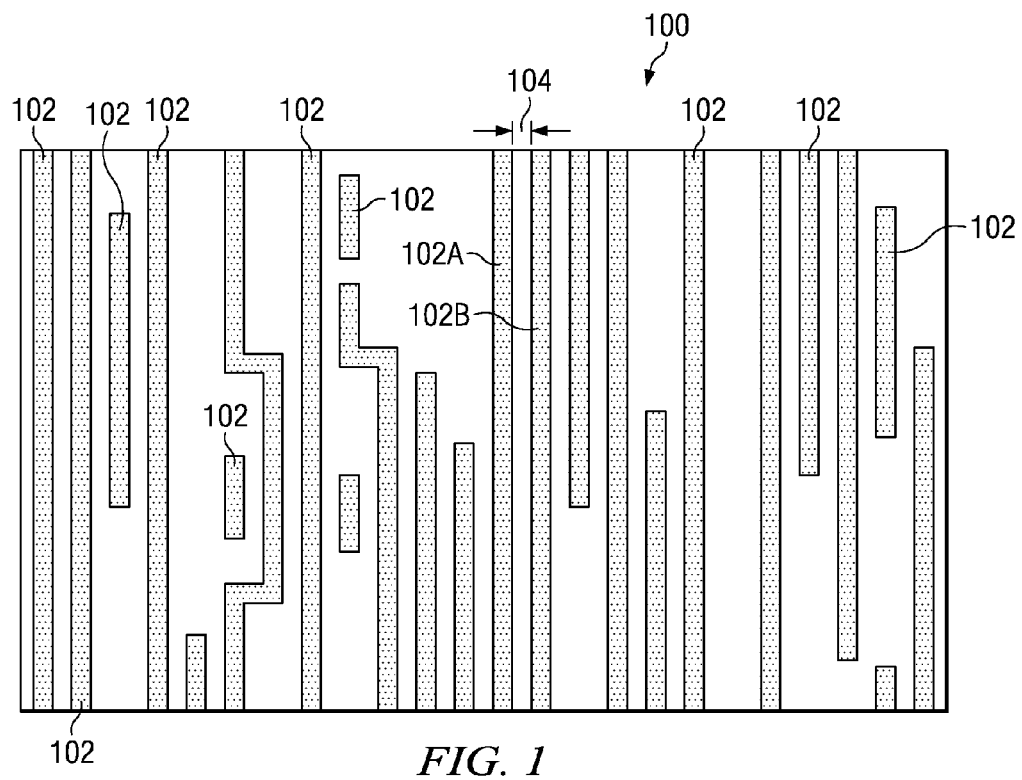
FIG. 1 shows a single integrated circuit (IC) layer to be formed via a single photolithographic mask.

Certain terms are used throughout the following description and claims to refer to particular system components. As one skilled in the art will appreciate, different companies can refer to a component by different names. This document does not intend to distinguish between components that differ in name but not function herein. In the following discussion and claims the terms "including" and "comprising" are used in an open ended fashion, and thus should be interpreted to mean "including, but not limited to . . . " Also, the term "couple" or "couples" is intended to mean either an indirect or direct electrical connection. Thus, if a first device couples to a second device, that connection may be through direct electrical connection, or through an indirect electrical connection via other devices and connections. Various numeric values are provided below, but these values are just examples and should not be used to limit the scope of the disclosure. Also, all numeric values are approximate. Further, the term "adjacent" is generally meant to be interpreted as "abutting" and/or "immediately next to," although in some embodiments, the term may be interpreted as "near" or "in close proximity to." Thus, two adjacent items may abut one another or may be separated by an intermediate item(s).

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. For example, as provided herein longitudinal lines are often described comprising a fixed pitch of 60 nm, however, one skilled in the art will appreciate that that the longitudinal lines may comprise any fixed pitch (e.g., 40 nm, 65 nm, etc.) or alternative longitudinal lines may comprise substantially fixed pitches (e.g., 60 nm +/−10 nm) resulting in an average fixed pitch (e.g., a mask having longitudinal lines with a fixed pitch of 118 nm and a mask having longitudinal lines with a fixed pitch of 122 nm may be used to result in longitudinal lines having an average fixed pitch of 60 nm). Nothing in this detailed description is admitted as prior art.

Described herein are methods and systems for generating photolithography masks and for processing integrated circuits. In many embodiments, two or more photolithography masks are used to collectively pattern a single layer of an integrated circuit. Thus, integrated circuit features that have previously been included on a single mask, such as metal 3 features included on a single metal 3 mask, for example, are now partitioned between at least two separate masks.

Referring now to FIG. 1, one can see a metal layer 100 which includes a number of longitudinal segments 102. As previously alluded to, in prior art methods and systems this metal layer 100 is made using a single photolithography mask. While these prior art systems may be sufficient to pattern this metal layer 100 if adjacent segments are separated by a sufficient distance (e.g., 100 nm or more), prior art systems run into problems when adjacent longitudinal segments are separated by less than some minimal distance (e.g., less than about 60 nm). Thus, when manufacturers attempt to "shrink" features for a new technology node, problems arise. For example, if prior art manufacturers using a single photolithographic mask exposure were to attempt to separate longitudinal segment 102A and longitudinal segment 102B by a distance 104 of less than about 30 nm, longitudinal segments 102A and 102B when actually formed on the physical integrated circuit would either tend to "blur" together or have gaps in their longitudinal segments. Therefore, aspects of the present invention remedy these deficiencies and allow manufacturers to produce features, such as metal lines, with previously unachievable feature sizes.

Figure 2:
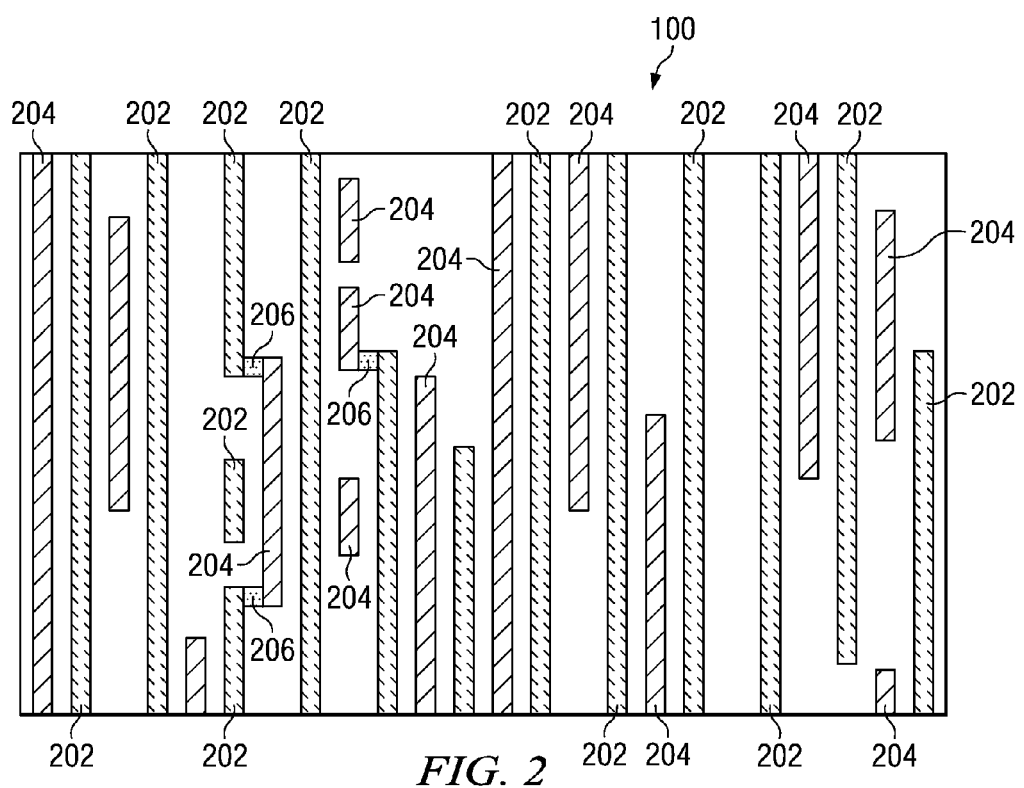
FIG. 2 shows a single IC layer to be formed via two separate photolithographic masks.

As shown in FIG. 2, some aspects of the present invention relate to systems and methods in which at least two separate masks are used to pattern and form a single IC layer. For example, FIG. 2 shows the same metal layer as in FIG. 1, except that in FIG. 2 some longitudinal segments are formed using a first mask (e.g., segments shaded with first pattern, such as longitudinal segment 202), while other longitudinal segments are formed using a second separate mask (segments shaded with second pattern, such as longitudinal segment 204). Coupling segments 206, which may be included on either the first mask or the second mask or on both the first and second masks, extend traversely to the longitudinal segments 202, 204 and act as "bridges" to connect two longitudinal segments to one another. Although this process may be somewhat more expensive than previous manufacturing approaches because it uses two or more masks to pattern a single IC layer, the process is advantageous nonetheless because it facilitates patterning of more tightly spaced features than previously achievable. Therefore, this process allows manufacturers to achieve high density integrated circuits with good performance metrics in line with customers' expectations. Now that some basic principles of some embodiments have been set forth, more detailed embodiments are described below.

Figure 3:
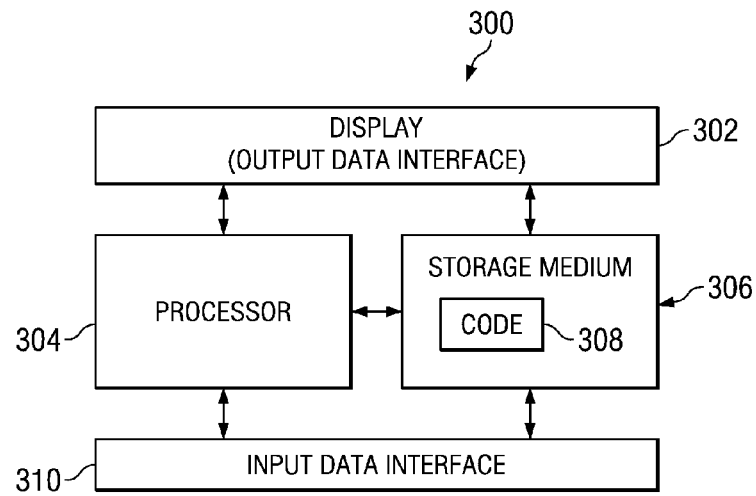
FIG. 3 shows a functional block diagram of a system in accordance with some embodiments.

FIG. 3 depicts a system 300 for implementing computer methods described herein. The system 300 includes a display 302 coupled to a processor 304. The processor 304 may be coupled with a storage medium 306 such as volatile or non-volatile memory that stores processor executable code 308 capable of causing the processor 304 to perform the processes described herein. An electronic mask set, design rules, and other appropriate programs and files may also be stored in the storage medium 306 and are often input via an input data interface 310. The processor 304 may retrieve and execute the code 308 to generate the electronic mask set. The electronic mask set, which includes multiple electronic masks for patterning a single IC layer, may then be displayed on the display 302 for use by the tool operator, engineer or other appropriate end user. The system 300 often outputs the electronic mask set in the form of a computer file. In some embodiments, the computer file may be in Graphical Data System Stream (.gdsii) format, Caltech intermediate file format, OASIS format, etc.

Figure 4:
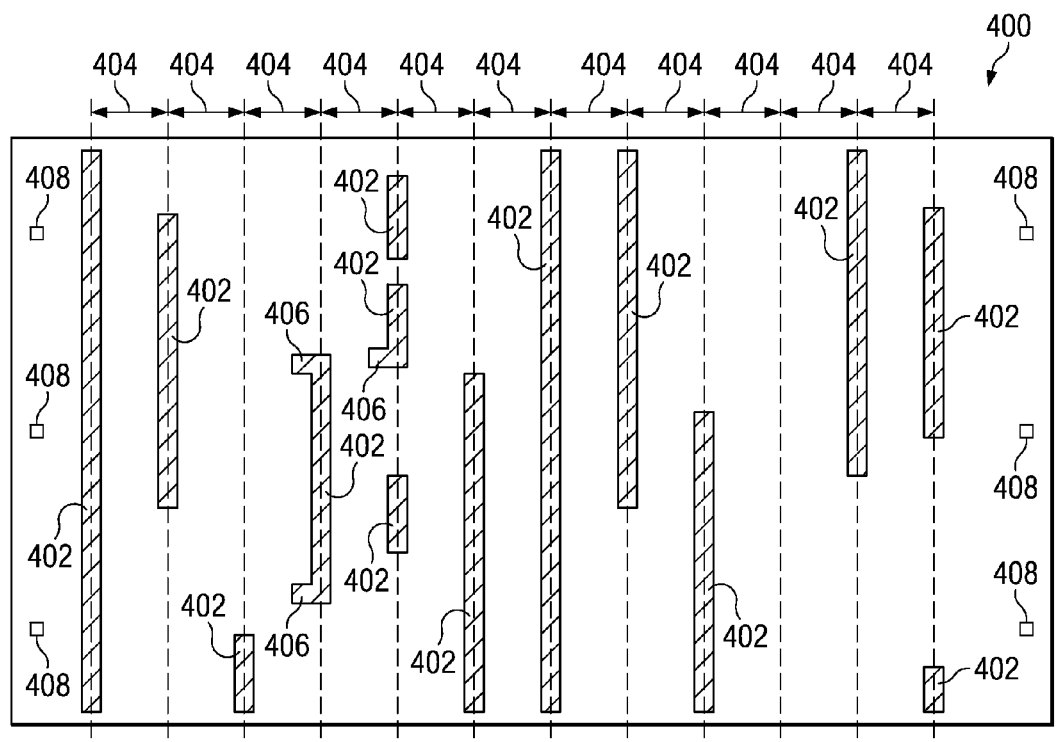
FIGS. 4-5 show first and second photolithography masks, respectively, used to pattern a single IC layer.
Figure 5:
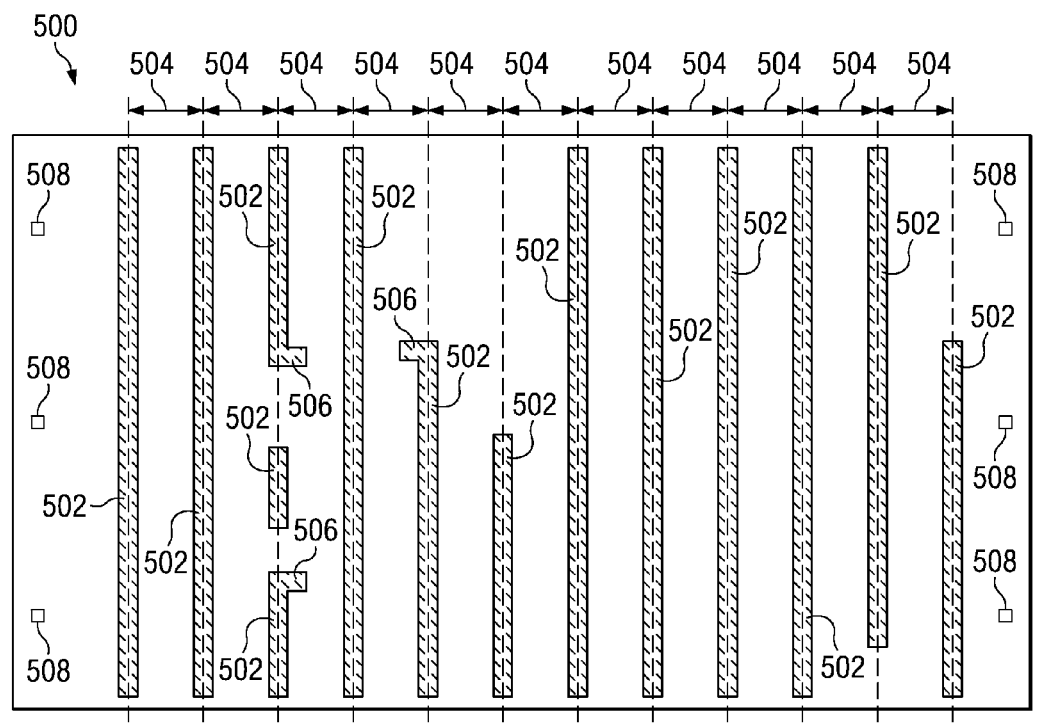
Figure 6:
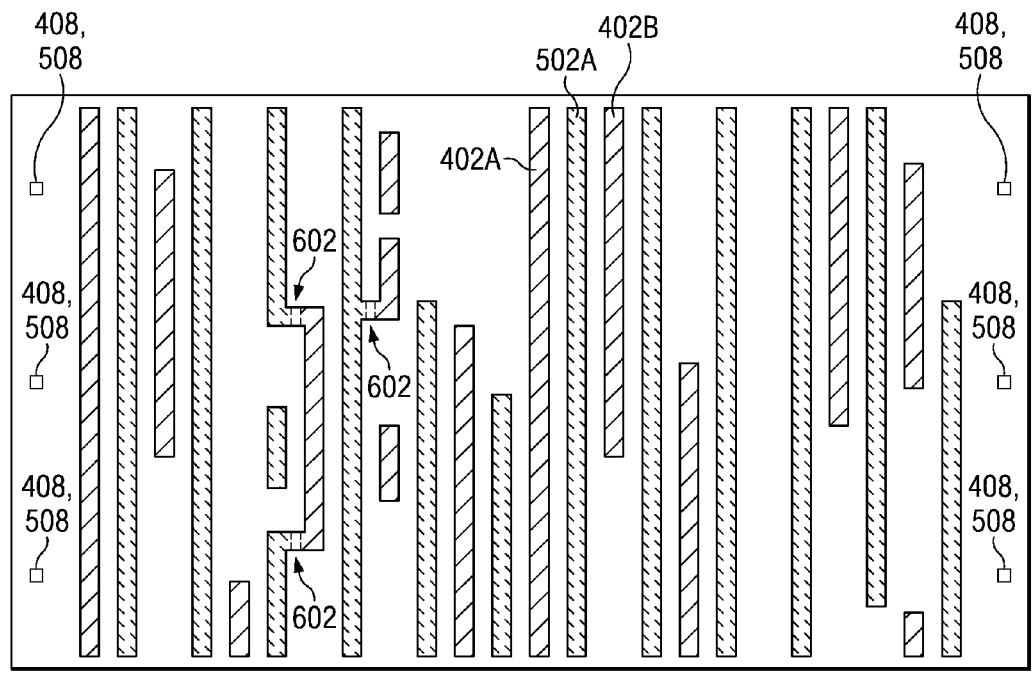
FIG. 6 shows the first and second photolithography masks from FIGS. 4-5 overlying one another.

Often, the electronic mask set will then be used to generate a physical mask set, which may be made up of reticles for patterning individual dies on a wafer. FIGS. 4-6 show an embodiment of a photolithography mask set that includes multiple physical masks to collectively pattern a single IC layer. As discussed in more detail below, FIG. 4 shows a first mask 400, FIG. 5 shows a second mask 500, and FIG. 6 shows the first and second masks 400, 500 superimposed over one another.

As shown in FIG. 4, the first mask 400 includes a first series subset of longitudinal segments 402 extending in parallel with one another along a first direction, as well as first portions of coupling segments 406 that extend traversely to the longitudinal segments 402. Neighboring longitudinal segments on the first mask are separated by a first distance 404, which can be the minimal distance required between segments such that the segments can be resolved by lithography. For example, in an embodiment where longitudinal segments have a width of approximately 30 nm and the desired final spacing between lines realized on the wafer is also 30 nm, the first distance 404 could be approximately 120 nm (as measured between centerlines of neighboring longitudinal segments). In addition, to ensure that successive masks and their corresponding IC layers are vertically aligned with regard to one another, the first mask 400 also includes a first set of alignment marks 408, which are often near the outer edges of the first mask 400.

As shown in FIG. 5, the second mask 500 includes a second series subset of longitudinal segments 502 extending in parallel with one another along the first direction. The most closely spaced neighboring longitudinal segments of the second series are separated by a second distance 504, which can be equal to the first distance 404 in many embodiments. The second mask 500 also includes second portions of coupling segments 506 and a second set of alignment marks 508.

As shown in FIG. 6, when the first and second masks 400, 500 are aligned (i.e., the first and second sets of alignment marks 408, 508 are aligned), a longitudinal segment from the second mask (e.g., longitudinal segment 502A) is spaced between a pair of neighboring longitudinal segments from the first mask (e.g., longitudinal segments 402A, 402B). In addition, coupling segments 602 (which may be included on only the first mask, on only the second mask, or on a combination of the first and second mask) extend between pairs of longitudinal segments to couple them to one another.

Several different configurations are possible for coupling segments depending on the implementation. Some illustrative configurations are now highlighted below with reference to FIGS. 7, 8A-8B, and 9A-9B. These illustrated configurations are not meant to be exhaustive of the arrangements for coupling segments, but rather are only non-limiting examples.

Figure 7:
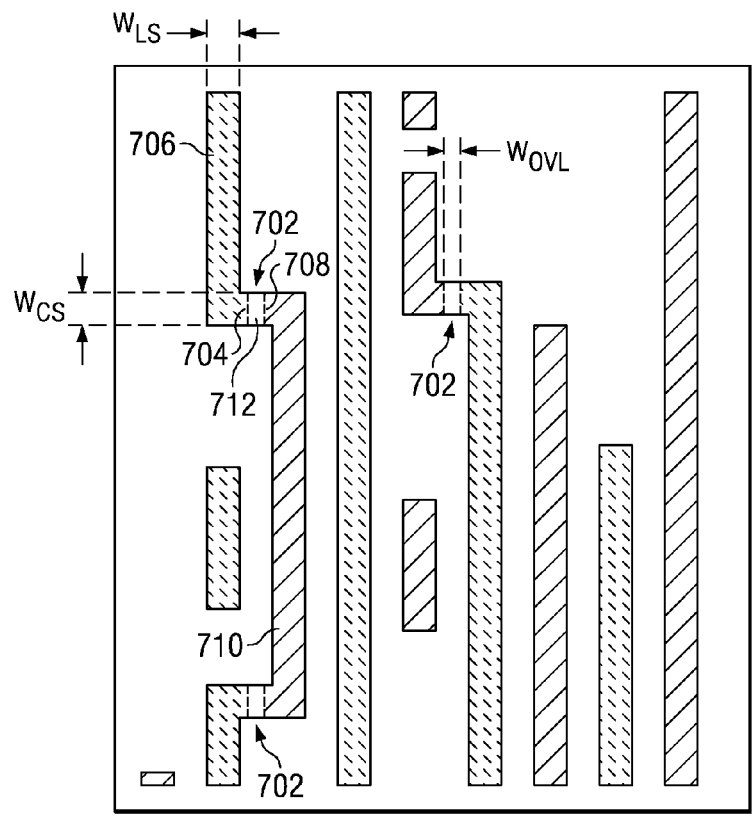
FIG. 7 shows a more detailed embodiment of first and second masks that include a coupling segment.

FIG. 7 illustrates an example where, when the first and second masks are aligned, coupling segments 702 each couple a longitudinal segment on the first mask to an adjacent longitudinal segment on the second mask. As shown, a first portion 704 of a coupling segment is disposed on the first mask 400. The first portion 704 has a first end coupled to longitudinal segment 706 and a second end that extends laterally therefrom. Somewhat similarly, a second portion 708 of the coupling segment is disposed on the second mask 500. The second portion 708 has a first end coupled to longitudinal segment 710 and a second end that extends laterally therefrom.

In the illustrated embodiment, the first and second portions 704, 708 overlap on a centerline between the longitudinal segments at overlap region 712, although the overlap region 712 could in other cases be offset with respect to the centerline. The geometry of the overlap region 712 is chosen to balance trade-offs between electrical conductivity and area. For example, to increase electrical conductivity of a coupling segment 702, the coupling segment 702 may have a width, $W_{CS}$, that is larger than the width of the longitudinal segments, $W_{LS}$. Thus, as the width of a coupling segment is increased, the conductivity will tend to increase (desirable) but the IC area will also tend to increase (undesirable).

In alternative embodiments, the coupling segment 702 may also have a width, $W_{CS}$, that is smaller than the width of the longitudinal segments, $W_{LS}$. If the width of the coupling segment is decreased, the conductivity will decrease (undesirable) and the alignment difficulty will increase (undesirable) but the lithographic perturbation (e.g., the detrimental effect on feature resolution, produced by the lithographic illumination of one feature, on other nearby features) on other nearby lines to be produced by the first and second mask will decrease (desirable). In addition embodiments, the extent of the overlap $W_{OVL}$ in the overlap region 712 can be varied to achieve the proper desired effects. For example, tradeoffs can be made between an increased overlap (with better conductive coupling, desirable) against a perturbation in patterning other nearby lines on the same mask that results from distorting the line from the simple longitudinal segments (typically loss of depth of focus, undesirable). The overlap width $W_{CS}$ and extent $W_{OVL}$ can also take in account factors like Optical Proximity Correction (OPC) error, Mask Error Enhancement Factor (MEEF), pull back, misalignment, and any other relevant factors that could affect sufficient electrical conduction through the coupling segments. In any event, different implementations can consider these and other factors to determine the extent of overlap, if any, necessary to deliver an end product that meets a particular set of requirements.

Figure 8A:
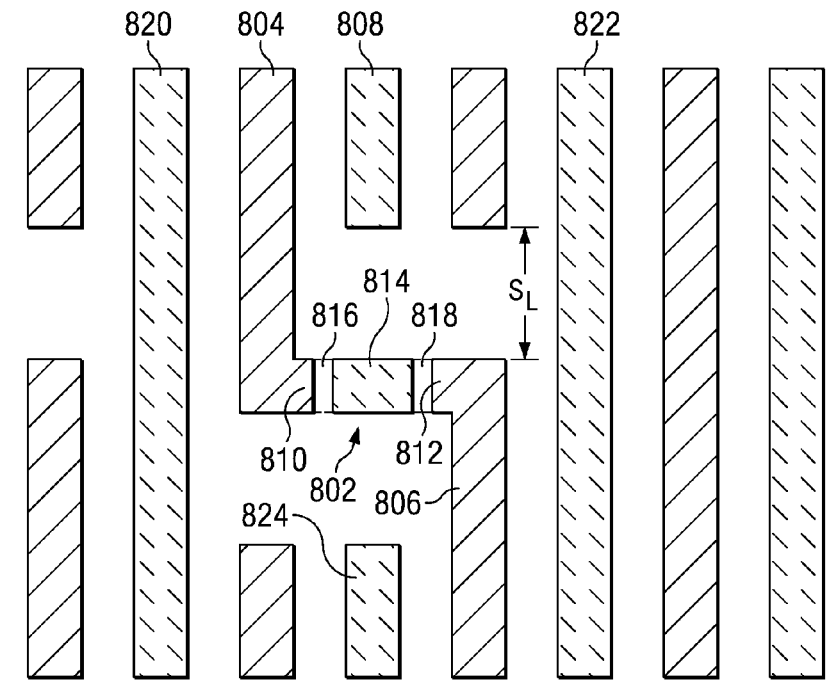
FIGS. 8A, 8B show other more detailed embodiments of first and second masks that include a coupling segment.
Figure 8B:
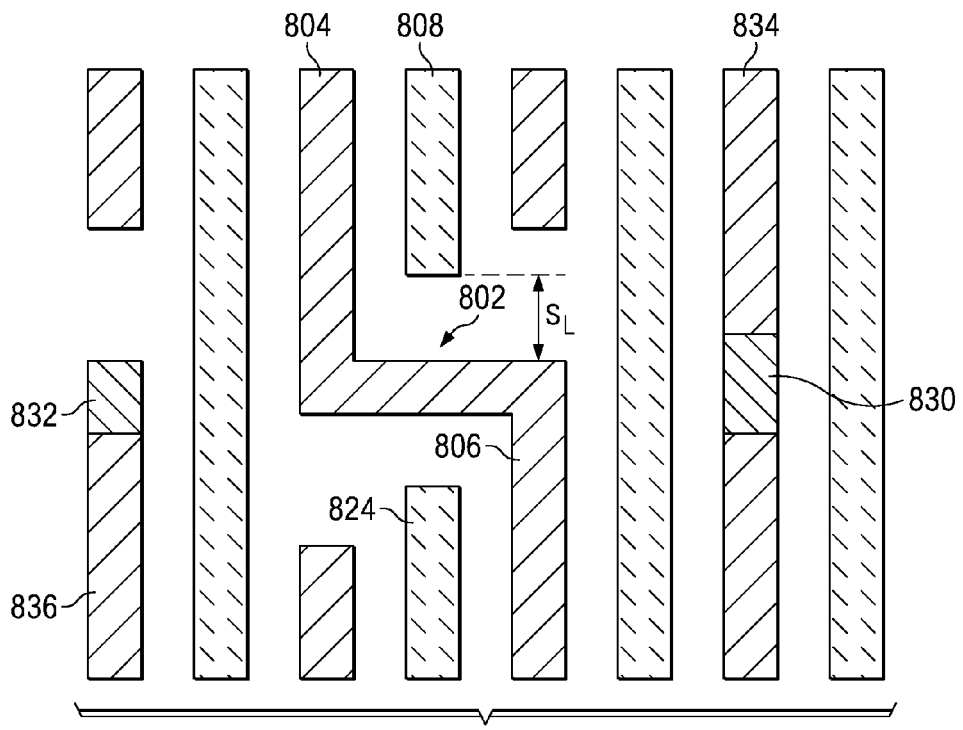

FIG. 8A-8B illustrate another example where, when the first and second masks are aligned, a coupling segment 802 couples a pair of longitudinal segments 804, 806, which have another longitudinal segment 808 spaced therebetween. Thus, in this example, both coupled longitudinal segments 804, 806 are disposed on the same mask (i.e., the first mask). In FIG. 8A's example, coupling segment 802 comprises three portions, namely: first and second portions 810, 812 disposed on the first mask, and a third portion 814 disposed on the second mask. The third portion 814 overlaps the first portion 810 at overlap region 816 and overlaps the second portion 812 at overlap region 818. The allowable lateral extent of the coupling segment 814 on the second mask may be limited by it perturbing effects in patterning other nearby lines 820 and 822 on the second mask. For example, the use of coupling segment 814 will limit the spacing $S_L$ between the coupling segment 814 and the nearest longitudinal segments, 808 and/or 824, that can be placed on the second mask since all of 814, 808, and 824 are produced in a single mask exposure step. Accordingly, the use of a coupling segment 814, as illustrated in FIG. 8A, may limit the density of useful segments.

In FIG. 8B's example, the coupling segment 802 is disposed entirely on the first mask and includes a single continuous portion that extends between longitudinal segments 804, 806. This embodiment may be advantageous in that it may tend to increase electrical conductivity for the coupling segment 802 because it is made out of a single lithographic feature, which may reduce processing defects. This embodiment may also improve the usable mask density since the bridge connecting longitudinal segments 804 and 806 will be entirely patterned using a first mask and the nearby longitudinal segments 808 and 824 will be patterned by a second mask, thereby decoupling any interfering optical effects due to the spacing $S_L$ between 802 and the longitudinal segments 808 and 824. However, the long lateral segment 802 will be poorly realized in any illumination scheme optimized for producing the longitudinal lines. It may therefore be advantageous to produce lateral segment 802 with a width specific to a situation. Longitudinal segment 802 also may produce regions of poor depth of focus, as, for example, at regions shaded regions 830 and 832 shown on nearby longitudinal segments 834 and 836.

In one embodiment, the width, $W_{CS}$, of the lateral coupling segment (e.g., 602, 702, 802) can be chosen independent of the widths, $W_{LS}$, of the longitudinal segments (e.g., 706, 804, etc.). By utilizing different widths, $W_{CS}$ and $W_{LS}$, designs can be optimized (e.g., to provide good coupling segment conductivity and minimal lithographic perturbation). In some embodiments the use of multiple values of the coupling segment widths, $W_{CS}$, within a set of masks used to produce a single layer on the wafer may be used to optimize the various situations, some of which have been illustrated in FIGS. 7 and 8 and will be discussed with respect to FIGS. 9 and 10.

Figure 9A:
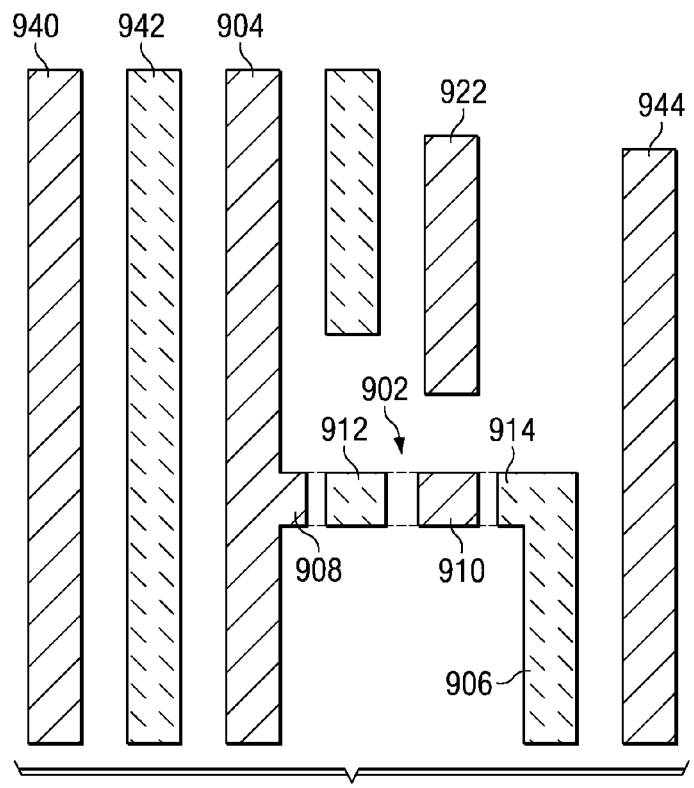
FIGS. 9A, 9B show still more detailed embodiments of first and second masks that include a coupling segment.
Figure 9B:
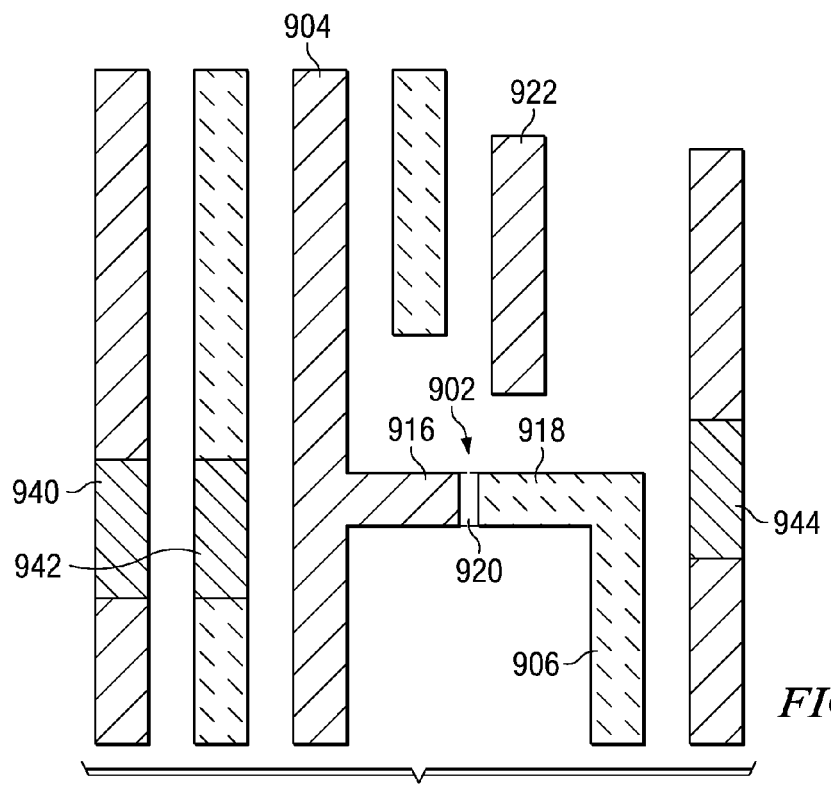

FIGS. 9A-9B illustrate another example where, when the first and second masks are aligned, a coupling segment 902 couples a longitudinal segment 904 on the first mask to a longitudinal segment 906 that is three longitudinal segments removed therefrom. In FIG. 9A's example, the coupling segment 902 comprises four portions, namely: first and second portions 908, 910 disposed on the first mask, and third and fourth portions 912, 914 disposed on the second mask. Again, the portions may overlap to ensure good electrical conductivity. In FIG. 9B, the segment 902 has been modified to include only first and second portions 916, 918 having overlap 920 therebetween.

Either or both of the embodiments shown as examples in FIGS. 9A and 9B may be successfully employed within a set of masks used to produce a single layer on the wafer, depending on factors like the nearness of other nearby desired features (for example, line 922 can be very near feature 910 (e.g., because they appear on different masks within the one-layer set of masks) but 922 must be further from feature 916 (e.g., because 922 and 916 appear on the same mask within the one-layer set of masks) thereby affecting the allowable end position(s) of feature 922 in the differing schemes) and the perturbing lithographic effects of the coupling segments 908, 912, 910, 914 or 916 and 918 on the successful realization of other nearby lines, for example near locations 940, 944 and separately 942. In addition, various differing widths and overlaps may be chosen for some or all the various coupling segments 908-918 that may differ from those chosen for the longitudinal segments in order to optimize the conduction, area usage, ease of alignment between the multiple masks in a set, and other lithographic, patterning and processing effects that are found to limit successful realization of some desired final product.

In typical single-mask photolithography schemes, it is found to be especially difficult to incorporate higher conductivity lines (usually formed from lines printed with a wider width and hence denoted "wide metal") because the perturbing photolithographic effects of wide lines on narrow lines prevents "wide metal" from being placed near the narrow lines. Accordingly, mixing wide and narrow lines typically results in relatively low usage density because large spaces must be left between the wide and narrow lines. However, the method and structure provided herein allow for the partitioning of high conductivity "wide" lines into a plurality of "narrow" lines that can be placed, without loss of line density, on a single IC layer and immediately adjacent to the regular narrow lines.

Figure 10A:
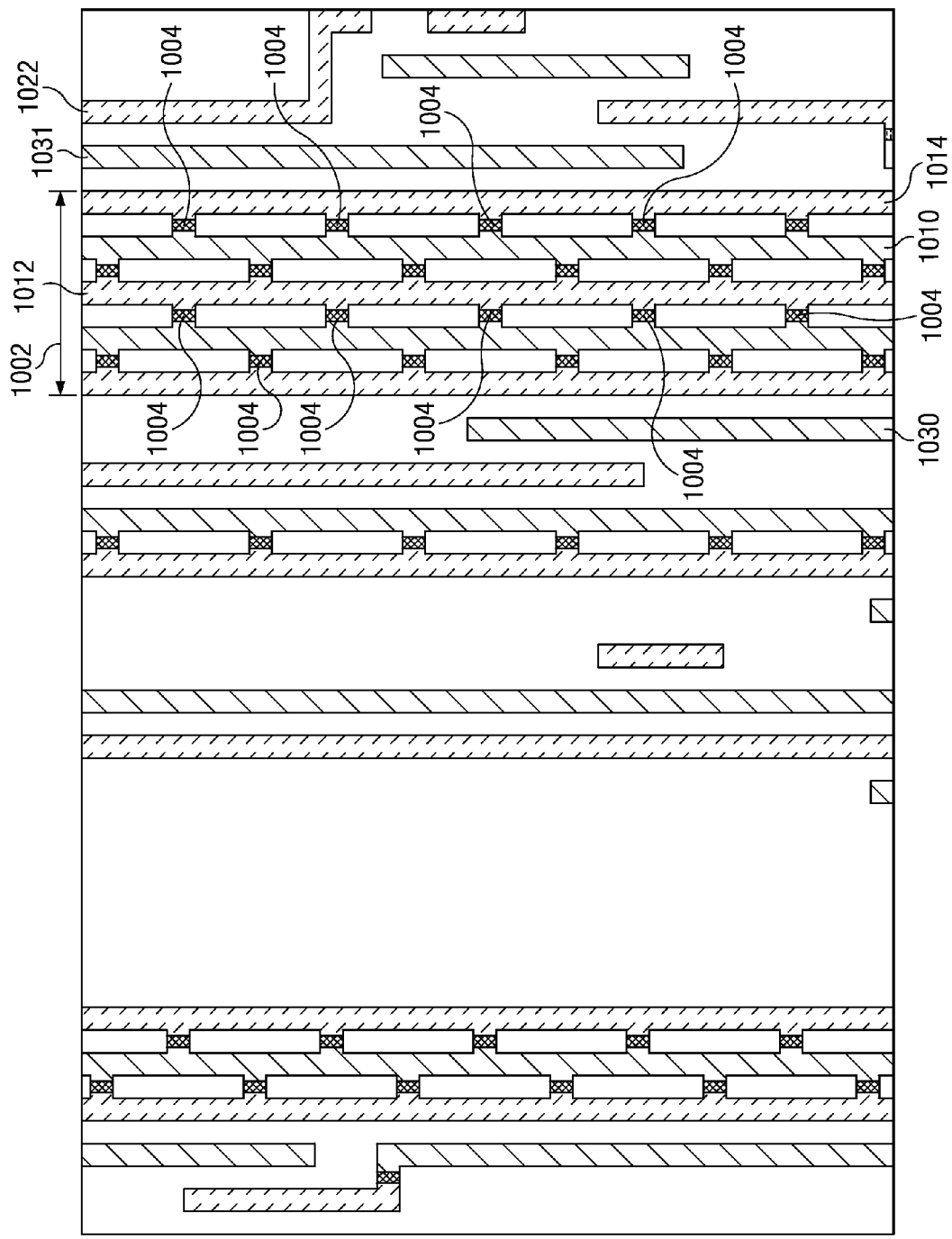
FIGS. 10A, 10B show embodiments of first and second masks that include a wide longitudinal segment, such as a power metal line.
Figure 10B:
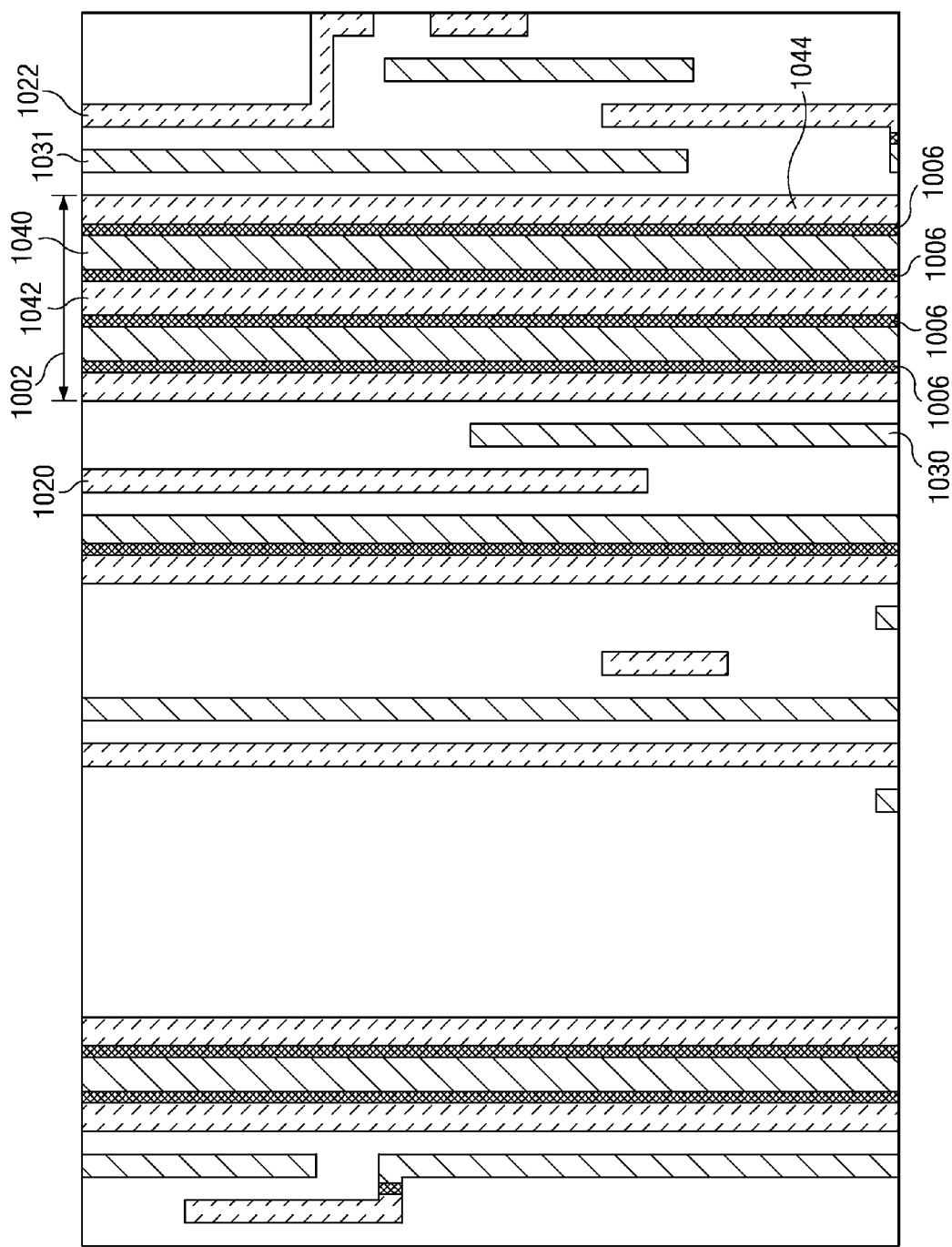

FIGS. 10A and 10B show two examples where the first and second masks include a wide longitudinal segment 1002, such as a power line for example, comprising a plurality of "narrow" lines. In FIG. 10A, the wide longitudinal segment 1002 comprises longitudinal segments disposed alternatingly between the first and second masks and having ladder-like coupling segments 1004 therebetween. More particularly, in one embodiment as illustrated in FIG. 10A, the ladder-like coupling segments are shown at a consistent vertical spacing along the right and left sides of longitudinal segment 1010 (i.e., one of the "narrow" lines with the set of "narrow" lines within wide segment 1002). The coupling segments are displaced one-half of that vertical spacing between the right and left hand sides of segment 1010 and met with similar coupling segments from "narrow" lines 1012 and 1014 (e.g., on the second mask) causing overlap regions 1004. Other methods of placing the coupling segments, such as placing the right and left coupling segments at the same vertical height, placing them at more than one vertical spacing, or dropping some coupling segments for some short regions where their effect is undesirable and unneeded can also be employed to good effect. As illustrated, line sets of 2, 3, 4, or more lines may be coupled for long or short lengths to produce "wide metal" of almost any desired width and length.

It will be appreciated that longitudinal segment 1014, comprising coupling segments into its wide segment 1002 on one side, may be placed at the standard "fine" pitch (e.g., 60 nm) with respect to independent longitudinal signal line 1031 with no loss of patterning density or disruptive effects on narrow longitudinal segments 1031 or 1022. Similarly, longitudinal segment 1030 can be at the "standard" spacing (e.g., 30 nm) from wide segment 1002 and have a "standard" width (e.g., 30 nm).

FIG. 10B illustrates an alternative embodiment for allowing wide longitudinal segments 1002 to be interspersed with high density in regions of fine pitch longitudinal segments. As illustrated in FIG. 10B, coupling segments 1006 comprise continuous longitudinal regions along the edges of fine pitch longitudinal segments 1040, 1042, and 1044, which collectively partially form wide longitudinal segment 1002. Longitudinal segments 1040 and 1042 comprise interior segments forming part of 1002. Segments 1040 and 1042 may be formed by choosing a suitable width so that, after patterning, they overlap in regions 1006, resulting in a continuous conductive path. Segment 1044 forms one of two exterior segments of 1002. For example, segment 1044 (e.g., formed by a first mask) may be configured to have a sufficient width such that it overlaps segment 1040 (e.g., formed by a second mask), collectively resulting in a continuous conductive path along the edge of 1002. The exterior edge of segment 1044, on its right, would be chosen so that the space to other-mask segment 1031 can be maintained at a "standard" spacing (e.g., 30 nm). Segments 1040 and 1044 may be carefully chosen in width to result in a small perturbation effect on printing independent nearby fine-line longitudinal segments such as 1031 and 1022. This is possible because all the longitudinal segments, whether forming part of 1002 or independent of 1002 (e.g., 1031 and 1022) can be exactly on one lithographic "pitch." Segments deeper into the interior of wide region 1002 may have different choices made for their widths to improve overlap, etc. That is, the overlap extent $W_{OVL}$ in regions 1006 may be varied to meet individual requirements associated with different longitudinal segments (e.g., 1040, 1042, 1044, etc, or sections of those segments) and may be different from the overlap extent $W_{OVL}$ chosen elsewhere (e.g., region 1004 of FIG. 10A or similar regions illustrated in FIGS. 6, 7, 8 and 9).

Regions with ladder-like coupling segments as illustrated by FIG. 10A and regions with continuous coupling overlap as illustrated by FIG. 10B may be mixed within regions on one or more masks of a single-layer mask set, used in separated regions of a mask set, or used separately in different mask sets as may be appropriate to meet different product requirements. Wide metal regions may further be "mixed" in the direction perpendicular to the longitudinal direction as, for example, in a wide region constructed of four or more "narrow" lines, the two outer "narrow" lines are coupled to the next two inward lines of the inner core of the wide region by ladder-like coupling segments, while the coupling segments between all but the two outer "narrow" lines is continuous.

Figure 11:
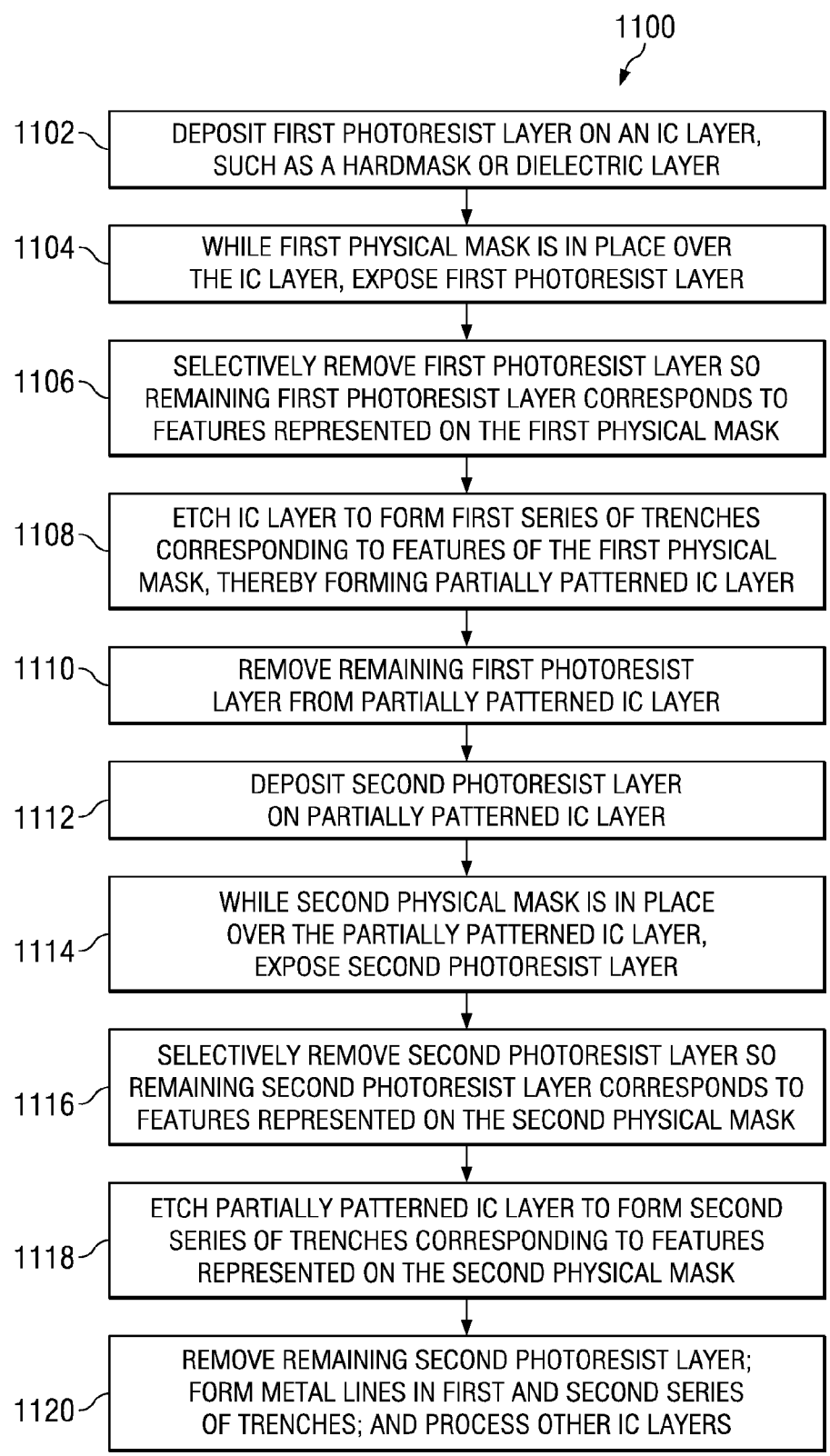
FIG. 11 shows a flow chart of a method for manufacturing an IC using the first and second photolithography masks in accordance with some embodiments.

To clearly illustrate one manner in which the first and second masks 400, 500 can be used, reference is made to FIG. 11 which shows a method 1100 for forming an integrated circuit. The method 1100 starts at block 1102, where a first photoresist layer is formed on an IC layer. The IC layer could be a hardmask or dielectric layer that overlies a metal layer, a metal layer, or some other IC layer.

At block 1104, a first exposure is performed on the first photoresist layer while the first mask is in place. This will expose some regions of the first photoresist layer (i.e., those regions which are not covered by the segments on the first mask) to electromagnetic radiation, while other regions (i.e., those regions which are covered by the segments on the first mask) are not exposed to the electromagnetic radiation. Any suitable mask type may be chosen for this first mask depending on numerous factors in the lithographic system employed with the mask and may include, for example, simple binary mask, embedded attenuated phase shift mask and other more complicated phase-shift mask types and may include either positive or negative masks.

At block 1106, the first layer of photoresist is then developed, which selectively removes either the exposed or unexposed portions of the photoresist, depending on whether positive or negative photoresist is employed.

At block 1108, while the patterned photoresist is in place, the IC layer is then etched to form a series of features corresponding to segments on the first mask. This results in partial patterning of the IC layer.

In block 1110, the remaining portions of the first layer of photoresist are removed; and in block 1112, a second photoresist layer is formed over the IC layer.

In block 1114, a second exposure is carried out on the second photoresist layer while the second mask is in place. This will expose some regions of the second photoresist layer, which are not covered by the segments on the second mask, to electromagnetic radiation, while other regions that are covered by the segments on the first mask are not exposed to the electromagnetic radiation. As with the first mask, any suitable mask type may be chosen for this second mask depending on numerous factors in the lithographic system employed with the mask and may include, for example, simple binary mask, embedded attenuated phase shift mask and other more complicated phase-shift mask types and may include either positive or negative masks.

In block 1116, the second layer of photoresist is then developed.

In block 1118, while the patterned photoresist is in place, the partially patterned IC layer is etched to include a second series of features corresponding to segments on the second mask. In this manner, the IC layer can be patterned to have features that are more densely packed than previously available. Metal lines can be formed, for example by a dual-damascene process, and additional processing can be carried out at 1120 to complete the integrated circuit.

Figure 12:
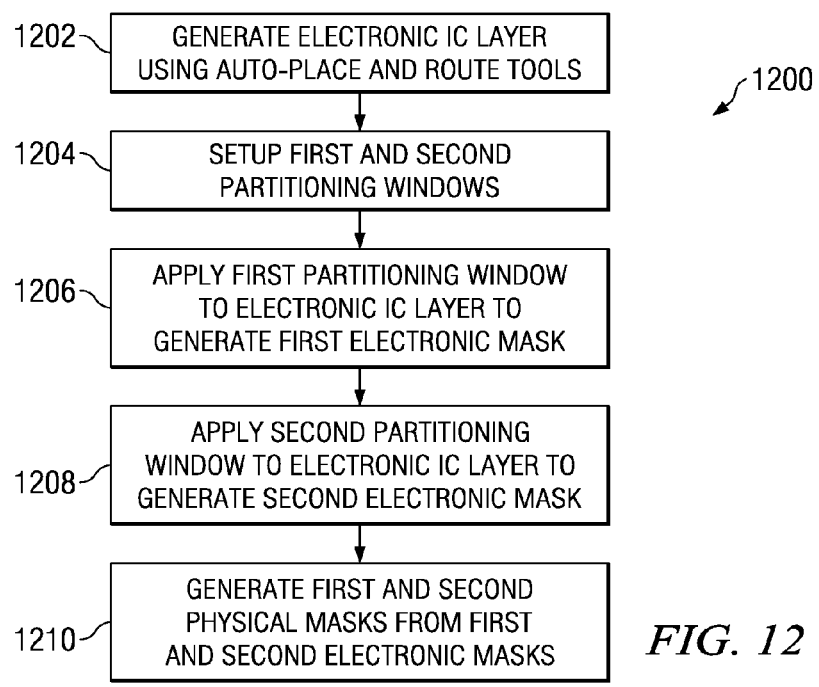
FIG. 12 shows a flow chart of a computer method for generating an electronic mask set in accordance with some embodiments.

Now that some illustrative systems and mask sets have been set forth, some illustrative computer methods for generating the mask set are now described below. For example, FIG. 12 shows a somewhat general embodiment for a computer method of generating multiple electronic photomasks (e.g., a first electronic mask and a second electronic mask) to pattern a single IC layer, and FIGS. 13-16 show a more detailed embodiment with reference to layout views at various stages of another method consistent with FIG. 12. Although these methods and other methods disclosed herein are illustrated and described as a series of acts or events, it will be appreciated that the present invention is not limited by the illustrated ordering of the acts or events. For example, some events may occur in different orders and/or concurrently with other events apart from those illustrated and/or described herein, in accordance with the invention. In addition, not all illustrated events may be required to implement a methodology in accordance with the present invention. These computer methods could be carried out on the system 100 previously described, as well as other systems not explicitly set forth herein.

Referring now to FIG. 12, one can see a flowchart that illustrates a somewhat general embodiment. Although the blocks of this flowchart are discussed below with reference to FIGS. 13-16, which show layout views consistent with FIG. 12's methodology, it will be appreciated that these layout views are not limiting.

Figure 13:
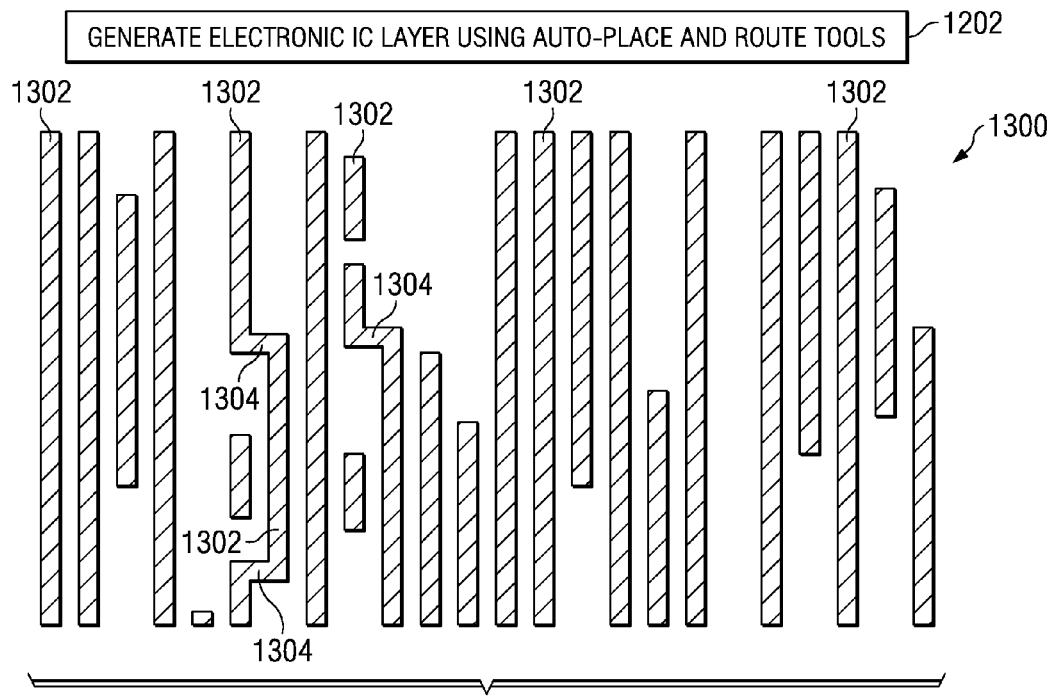
FIGS. 13-16 show more detailed views of method sub-blocks consistent with FIG. 12's method.

In FIG. 13, an electronic IC layer 1300 is generated using automatic place-and-route tools. In alternative embodiments, any other suitable method of generation of the IC layout may also be use. The electronic IC layer 1300 includes longitudinal segments 1302 and coupling segments 1304 that couple longitudinal segments to one another. The system will normally be chosen such that single longitudinal segments are arranged predominantly aligned along lines placed at the minimum pitch of the desired pattern (i.e., longitudinal segments are arranged to be spaced apart at a minimum segment spacing). Due to the close spacing of the longitudinal segments 1302 of the electronic IC layer, it may be impractical to use a single mask exposure when forming a physical integrated circuit based on this electronic IC layer.

Figure 14:
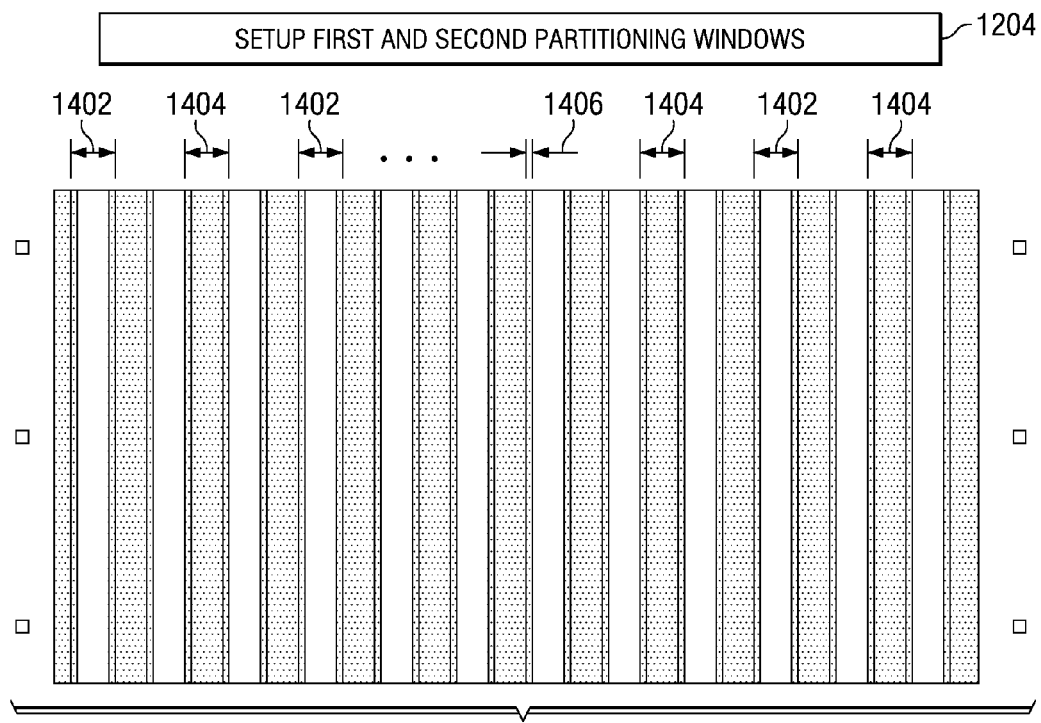

To allow the electronic IC layer 1300 to print properly on the actual IC, first and second partitioning windows 1402, 1404 are set up in FIG. 14. The regions of the first and second partitioning windows will generally align with the longitudinal segments of the IC layer 1300. For example partitioning region 1402 aligns with longitudinal segment 1302, such that longitudinal segment 1302 is comprised within partitioning window 1402. Each partition window will usually have a pitch that is 2× the predominant (i.e., minimum) pitch of the desired pattern 1300. Often, an overlap 1406 exists between the first and second partitioning windows 1402, 1404.

Figure 15:
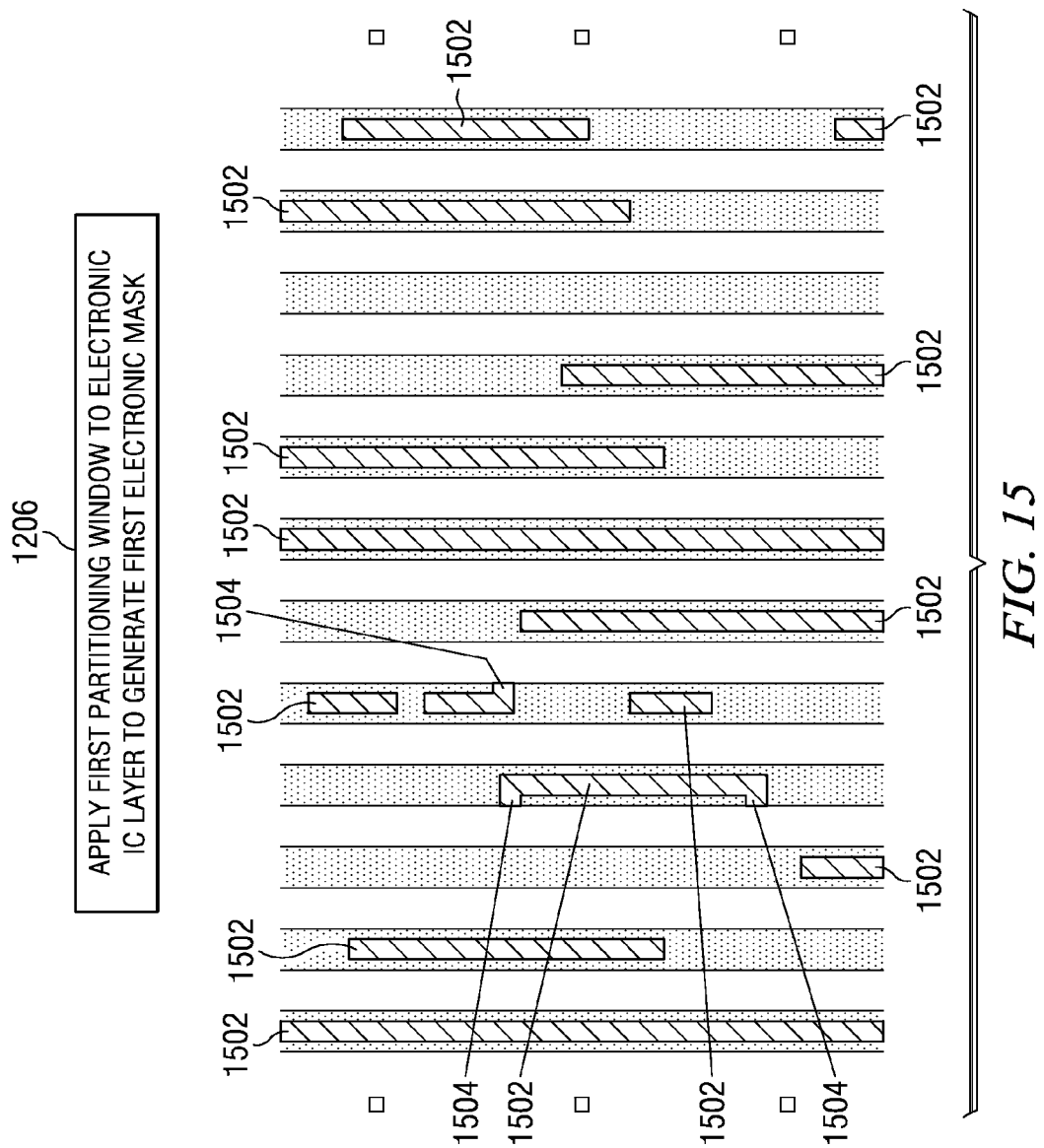

FIG. 15 illustrates the first partitioning window 1402 applied to the electronic IC layer 1300. A first mask is then generated to comprise segments within the first partitioning window. As shown in FIG. 15, this effectively selects equally spaced longitudinal segments 1502 from the IC layer to include on the first mask. First portions of coupling segments 1504 are also selected for inclusion on the first mask.

Figure 16:
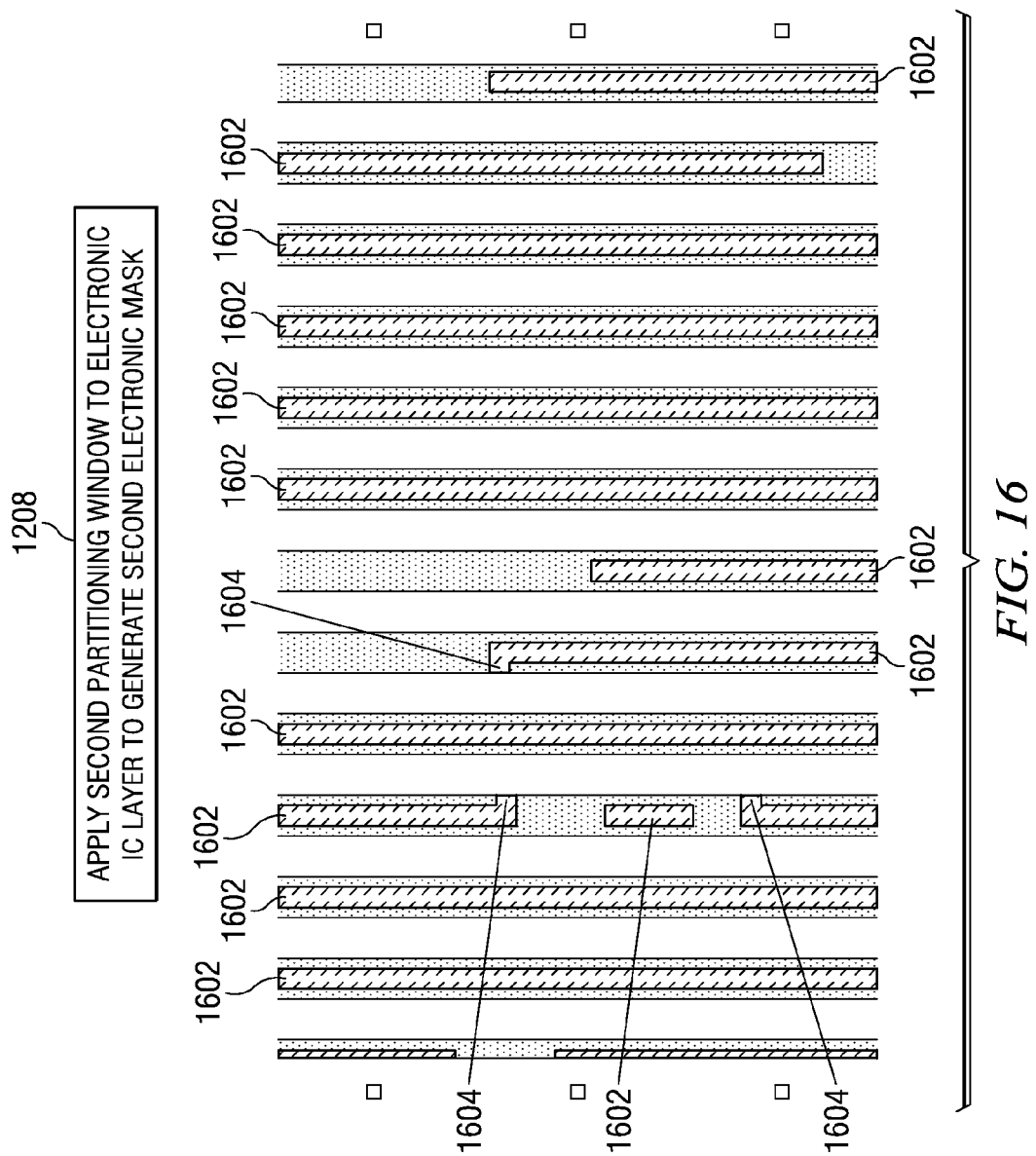

In FIG. 16, the second partitioning window 1404 is applied to the electronic IC layer 1300. A second mask is then generated to comprise segments within the second partitioning window. As shown in FIG. 16, this effectively selects equally spaced longitudinal segments 1602 from the IC layer to include on the second mask. Second portions of coupling segments 1604 are also selected for inclusion on the second mask.

For simplicity of illustration here, the overlap regions 1406 have been shown here having a single overlap extent value. They may have been constructed however to have varying extents in different regions of the layer depending on local shapes within the originating data as previously discussed. Alternately, a single overlap extent value may be used in the partitioning windows as shown in FIG. 14 and then the overlap regions may be optimized for local conditions after the formation of the two (or more) data sets as illustrated by FIGS. 15 and 16. Similarly the widths $W_{CS}$ of the overlap coupling segments may be optimized before or after the partition of the data.

It will be appreciated that prior to formation of the physical masks, the two or more mask partitions thus derived may be further processed for proximity effect corrections, often referred to as Optical Proximity Correction or OPC processing. Alternatively, other suitable mask data preparation steps, known by those skilled in the art to fully convert the desired layout, may be used to partition a design into two or more physical masks for use in IC fabrication machinery. In this manner, an electronic mask set is generated that may be used to make a physical mask set as previously discussed.

Equivalent alterations and/or modifications may occur to those skilled in the art based upon a reading and/or understanding of the specification and annexed drawings. For example, although some embodiments are shown and described with respect to only first and second masks (i.e., two separate masks) for patterning a single IC layer, the inventive concept is also applicable to more than two masks for patterning a single IC layer. For example, although previously discussed FIG. 6 showed a longitudinal segment 502A spaced halfway between the pair of neighboring longitudinal segments 402A, 402B; in general, however, additional masks beyond only first and second masks can also be used to pattern the IC layer. The use of additional masks allows even closer spacing between longitudinal segments. Thus, generally speaking, a longitudinal segment from one mask can be spaced at a unit fraction of a distance separating a pair of neighboring longitudinal segments on another mask. For example, if three masks are used to pattern the single IC layer the unit fraction could be ⅓, if four masks are used to pattern the single IC layer the unit fraction could be ¼, and so on.

In addition, although some aspects of the disclosure have been discussed with reference to metal lines, it will be appreciated that the invention is also applicable to other IC features including but not limited to: contacts, vias, implantation regions, wells, poly lines, and others. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A computer implemented method for providing a photolithography mask set for printing an automatically placed and routed metal layer of an integrated circuit having adjacent features spaced at less than a given minimum separation distance, the method comprising:
generating a routing configuration for the metal layer using automatic place-and-routing tools, the routing configuration comprising longitudinal segments extending parallel at a given minimum pitch providing target separation distances of less than the given minimum separation distance;
using a computer, applying a first partitioning window to the generated routing configuration to select a first series subset of the longitudinal segments, the first partitioning window having a pitch of twice the minimum pitch and the first series segments extending parallel at first separation distances of at least the given minimum separation distance;
generating a first photolithography mask with a pattern for printing the first series segments;
using a computer, applying a second partitioning window to the generated routing configuration to select a second series subset of the longitudinal segments not selected by the first partitioning window, the second partitioning window having a pitch of twice the minimum pitch and the second series longitudinal segments extending parallel at second separation distances of at least the given minimum separation distance; and
generating a second photolithography mask with a pattern for printing the second series segments;
wherein an integrated circuit layer collectively patterned using the first and second masks will apply the routing configuration comprising the longitudinal segments at the target separation distances less than the given minimum separation distance.

2. The method of claim 1, wherein the generated routing configuration includes coupling segments transversely coupling different longitudinal segments; the first partitioning window selects first portions of the coupling segments; the first mask pattern includes patterning for printing the first coupling segment portions; the second partitioning window selects second portions of the coupling segments; the second mask pattern includes patterning for printing the second coupling segment portions; and wherein the collective patterning will apply the routing configuration with the coupling segments transversely coupling the different longitudinal segments.

3. The method of claim 2, wherein the first and second partitioning windows have partitioning regions generally aligned with the routing configuration longitudinal segments.

4. The method of claim 3, wherein the first and second separation distances are equal.

5. The method of claim 4, wherein the partitioning regions of the respective first and second partitioning windows are spaced at pitches equal to two times a pitch spacing of the routing configuration longitudinal segments.

6. The method of claim 5, wherein the first and second partitioning windows have overlapping partitioning regions.

7. The method of claim 1, wherein the first and second partitioning windows have partitioning regions generally aligned with the routing configuration longitudinal segments.

8. The method of claim 1, wherein the first and second separation distances are equal.

9. The method of claim 1, wherein the partitioning regions of the respective first and second partitioning windows are spaced at pitches equal to two times a pitch spacing of the routing configuration longitudinal segments.

10. The method of claim 1, wherein the first and second partitioning windows have overlapping partitioning regions.

11. The method of claim 1, wherein the first and second partitioning windows have partitioning regions aligned with different alternating ones of the routing longitudinal segments.

12. A method for patterning a metal layer of an integrated circuit having adjacent features spaced at less than a given minimum separation distance, the method comprising:
generating a routing configuration for the metal layer using automatic place-and-routing tools, the routing configuration comprising longitudinal segments extending parallel at target separation distances less than the given minimum separation distance;
using a computer, applying a first partitioning window to the generated routing configuration to select a first series subset of the longitudinal segments, the first series segments extending parallel at first separation distances of at least the given minimum separation distance;
generating a first photolithography mask with a pattern for printing the first series segments;
using a computer, applying a second partitioning window to the generated routing configuration to select a second series subset wherein the first and second partitioning windows have partitioning regions aligned with different alternating ones of the routing longitudinal segment of the longitudinal segments, the second series longitudinal segments extending parallel at second separation distances of at least the given minimum separation distance;
generating a second photolithography mask with a pattern for printing the second series segments; and
collectively patterning an integrated circuit layer using the first and second masks to apply the routing configuration comprising the longitudinal segments at the target separation distances less than the given minimum separation distance.

13. The method of claim 12, wherein the generated routing configuration includes coupling segments transversely coupling different longitudinal segments; the first partitioning window selects first portions of the coupling segments; the first mask pattern includes patterning for printing the first coupling segment portions; the second partitioning window selects second portions of the coupling segments; the second mask pattern includes patterning for printing the second coupling segment portions; and the collective patterning applies the routing configuration with the coupling segments transversely coupling the different longitudinal segments.

14. The method of claim 13, wherein collectively patterning the integrated circuit layer comprises:
   patterning a first photoresist layer over the integrated circuit layer with the first mask pattern using the first mask;
   patterning a second photoresist layer over the integrated circuit layer with the second mask pattern using the second mask;
   transferring the first mask pattern from the patterned first photoresist layer to the integrated circuit layer; and
   transferring the second mask pattern from the second photoresist layer to the integrated circuit layer.

15. The method of claim 14, wherein the integrated circuit layer comprises a dielectric layer.

16. The method of claim 15, wherein the dielectric layer is etched to transfer the first and second mask patterns; and the metal layer is formed by depositing metal within etched portions of the dielectric layer.

* * * * *